(12) United States Patent
Schreiber et al.

(10) Patent No.: US 11,514,956 B2
(45) Date of Patent: Nov. 29, 2022

(54) SENSE AMPLIFIER SLEEP STATE FOR LEAKAGE SAVINGS WITHOUT BIAS MISMATCH

(71) Applicant: Advanced Micro Devices, Inc., Santa Clara, CA (US)

(72) Inventors: Russell J. Schreiber, Austin, TX (US); Ryan T. Freese, Ft. Collins, CO (US); Eric W. Busta, Ft. Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/133,956

(22) Filed: Dec. 24, 2020

(65) Prior Publication Data

US 2022/0208234 A1   Jun. 30, 2022

(51) Int. Cl.
*G11C 7/06* (2006.01)
(52) U.S. Cl.
CPC .................................... *G11C 7/065* (2013.01)
(58) Field of Classification Search
CPC .................................................... G11C 7/065
See application file for complete search history.

(56) References Cited

U.S. PATENT DOCUMENTS

| 10,566,036 | B2 | 2/2020 | Kawamura |
| 2006/0285412 | A1* | 12/2006 | Hummler ............. G11C 11/406 365/222 |
| 2012/0250440 | A1* | 10/2012 | Wu ...................... G11C 11/413 365/207 |
| 2019/0355411 | A1 | 11/2019 | Subramanian et al. |

* cited by examiner

*Primary Examiner* — Tuan T Nguyen
(74) *Attorney, Agent, or Firm* — Zagorin Cave LLP

(57) ABSTRACT

A sense amplifier is biased to reduce leakage current equalize matched transistor bias during an idle state. A first read select transistor couples a true bit line and a sense amplifier true (SAT) signal line and a second read select transistor couples a complement bit line and a sense amplifier complement (SAC) signal line. The SAT and SAC signal lines are precharged during a precharge state. An equalization circuit shorts the SAT and SAC signal lines during the precharge state. A differential sense amplifier circuit for latching the memory cell value is coupled to the SAT signal line and the SAC signal line. The precharge circuit and the differential sense amplifier circuit are turned off during a sleep state to cause the SAT and SAC signal lines to float. A sleep circuit shorts the SAT and SAC signal lines during the sleep state.

13 Claims, 5 Drawing Sheets

SENSE AMPLIFIER SLEEP STATE FOR LEAKAGE SAVINGS WITHOUT BIAS MISMATCH

BACKGROUND

Description of the Related Art

FIG. 1 illustrates a prior art sense amplifier circuit 100. The sense amplifier circuit 100 includes read column select transistors 102 and 104 that function to select a desired bit line pair to couple to the sense amplifier circuit 100. Read column select transistor 102 couples (or isolates) the bit line true signal line 106 and the sense amplifier true (SAT) signal line 108. Read column select transistor 104 couples (or isolates) the bit line complement signal line 110 and the sense amplifier complement (SAC) signal line 112. The read column select control signal RDCSX is active low as indicated by the "X". The precharge transistors 114 and 116 precharge the SAT and SAC signal lines to VDD responsive to assertion of the active low sense amplifier precharge signal SAPCX in preparation for a read operation. The equalizer transistor 118 is also coupled to SAPCX and shorts together SAT 108 and SAC 110 while precharge is active. Once the SAT and SAC signal lines are precharged, and the bit lines BLT and BLC are precharged by a separate precharge circuit, the precharge transistors 114 and 116 and equalizer transistor 118 are turned off, the read column selects are turned on to couple the bit lines to the sense amplifier SAT and SAC signal lines. A differential charge builds up on the SAT and SAC signal lines corresponding to the value of the memory cell being read. Once that differential charge has built up, the differential sense amplifier circuit 120 is turned on using the sense amplifier enable signal SAEN to latch the value of the memory cell being read.

Differential sense amplifier circuit 120 and other differential amplification circuitry are very sensitive to any kind of differential aging of the matched transistors 122 and 124. Differential aging occurs when the matched transistors are subject to different voltages. Thus, when the sense amplifier circuit 100 is idle (memory reads inactive), it is undesirable to leave the sense amplifier latched (SAEN=1) and precharge disabled (SAPCX=1) as the matched field effect transistors 122 and 124 would have asymmetric biasing. If the sense amplifier stays in evaluate mode (sense amplifier latched with SAEN asserted), the sense amplifier experiences full VDD bias mismatch between the matched NFETs 122 and 124 and such asymmetric biasing would lead to asymmetric aging and additional sense amplifier mismatch over time. A high field on a device causes the threshold voltage to shift up. If one matched transistor ends up with a different threshold voltage over time as compared to the other transistor, the operation of the differential sense amplifier circuit is degraded. To avoid asymmetric aging, the matched transistors 122 and 124 are ideally kept biased at the same voltage through most of their lifetime.

Another alternative would be to allow SAT and SAC to remain floating by disabling SAEN and SAPCX. However, allowing SAT and SAC to float also leads to asymmetric biasing as the floating values are unknown but can reflect the voltages present on SAT and SAC at the time SAEN and SAPCX are disabled. Thus, a solution to asymmetric aging is to leave the sense amplifier 100 precharged by leaving SAPCX asserted during idle. That ensures that the biasing of the matched transistors 122 and 124 is equal during idle.

However, leaving the SAT and SAC signal lines precharged during idle leads to another problem, namely undesired leakage current. If the sense amplifier remains in precharge during idle, leakage paths 126 and 128 exist from the sense amplifier precharge transistors 114 and 116 (which are on) down through NTAIL device 126 and also from amplifier precharge transistors 114 and 116 to floating bitlines BLT and BLC through leakage paths 130 and 132. The bitlines 106 and 110 are often kept at high-Z during idle cycles. When the bit lines float below VDD, the drain to source voltage (Vds) of the read select transistors 102 and 104 becomes greater than 0 creating the leakage paths 130 and 132 leading to leakage current. One way to deal with such leakage is to use high threshold devices, long channel devices, etc., in the sense amplifier to reduce leakage while leaving the sense amplifier in precharge. However, that results in slowing down the operation of the SRAM.

Thus, the traditional static random access memory (SRAM) sense amplifier shown in FIG. 1 cannot be simultaneously biased for low mismatch to reduce asymmetric aging concerns and for low leakage.

SUMMARY OF EMBODIMENTS OF THE INVENTION

In order to improve sense amplifier biasing to reduce leakage current while simultaneously addressing asymmetric biasing and aging, a memory includes a sense amplifier circuit that has a first read select transistor coupled between a true bit line and a sense amplifier true signal line and a second read select transistor coupled between a complement bit line and a sense amplifier complement signal line. A precharge circuit is responsive to a precharge state to precharge the sense amplifier true signal line and the sense amplifier complement signal line to a predetermined voltage. An equalization circuit is responsive to the precharge state to short the sense amplifier complement signal line and the sense amplifier true signal line. A differential sense amplifier circuit has a first input coupled to the sense amplifier true signal line and a second input coupled to the sense amplifier complement signal line. A sense amplifier sleep circuit is responsive to a sleep state to short the sense amplifier complement signal line and the sense amplifier true signal line during the sleep state.

In another embodiment a method includes shorting together a sense amplifier true signal line that is floating and a sense amplifier complement signal line that is floating during a sleep state of a sense amplifier circuit.

In another embodiment an apparatus includes a differential amplifier circuit coupled to receive a positive input signal line and a complement input signal line. A sleep circuit shorts together the positive input signal line and the complement input signal line during a sleep state in which the positive input signal line and the complement input signal line are floating.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
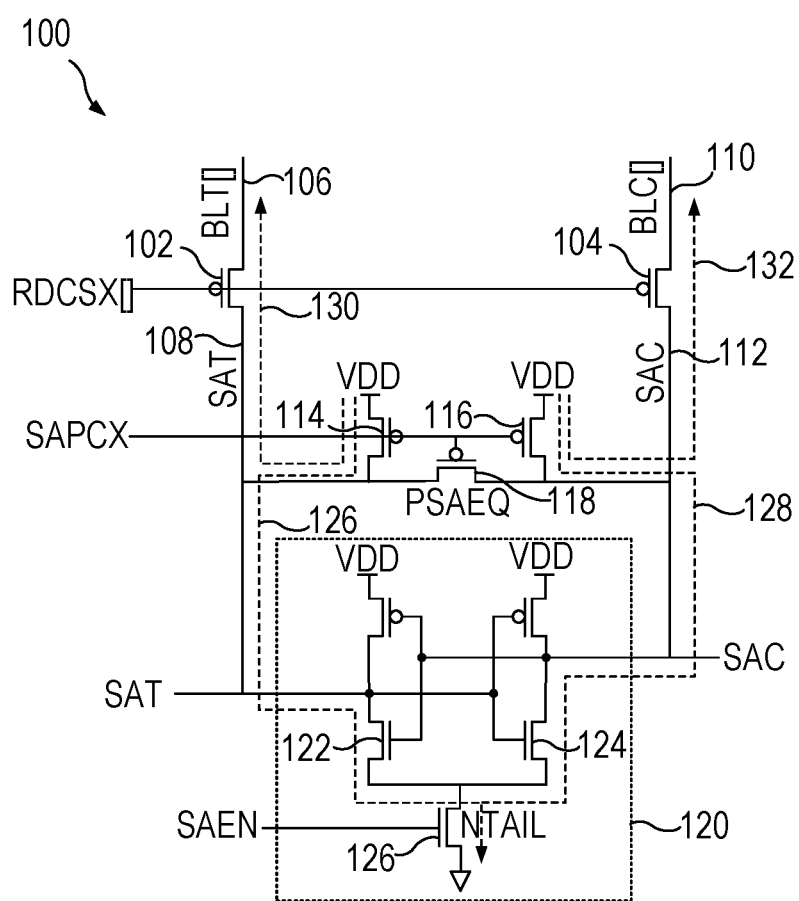
FIG. 1 illustrates a prior art sense amplifier circuit and current leakage paths associated therewith.
Figures 2, 3:
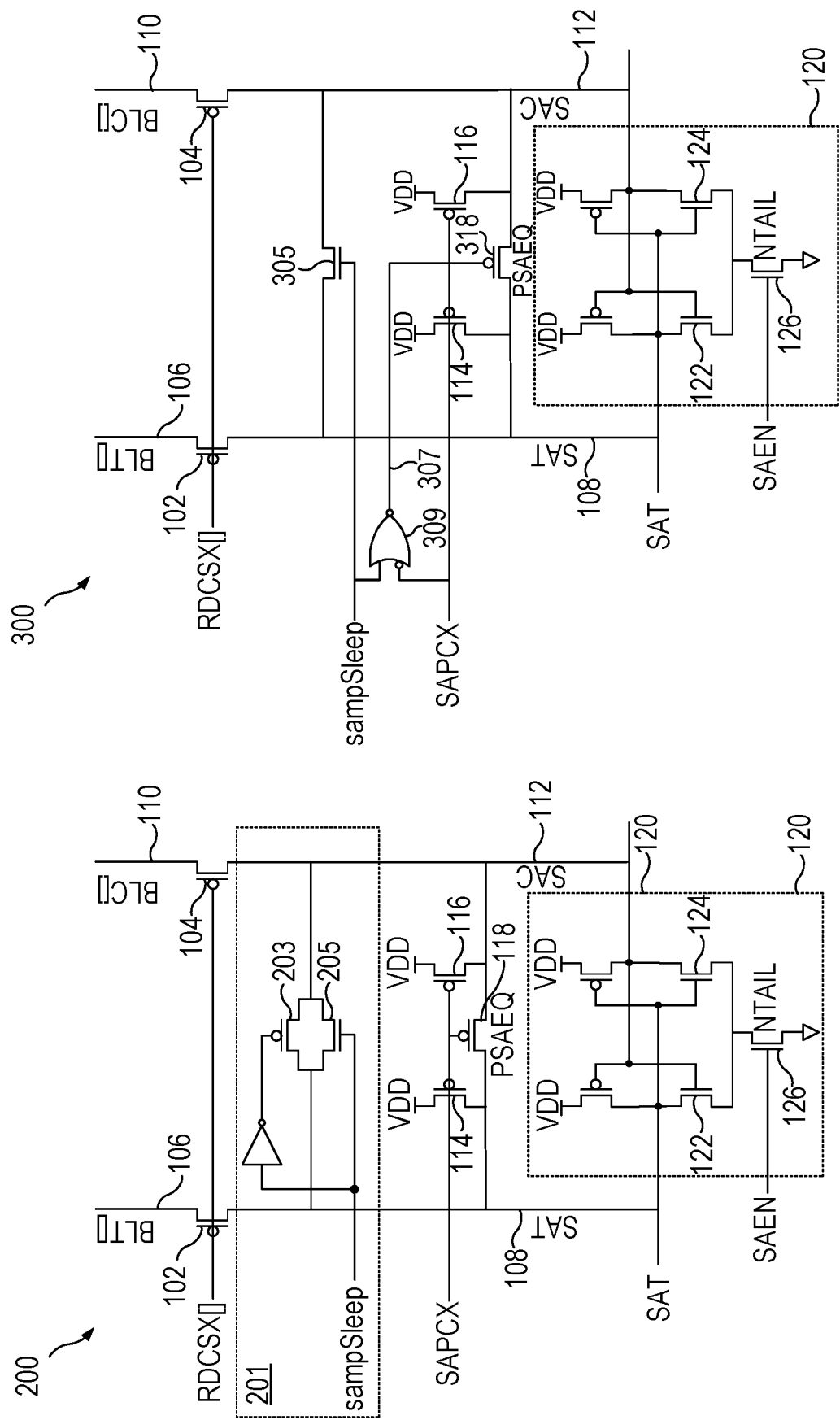
FIG. 2 illustrates an embodiment of a sense amplifier circuit that is biased to both equalize voltage across matched transistors and reduce leakage current by shorting together sense amplifier true and sense amplifier complement signal lines during the sleep state.
FIG. 3 illustrates another embodiment of a sense amplifier circuit that is biased to both equalize voltage across matched transistors and reduce leakage current by shorting together sense amplifier true and sense amplifier complement signal lines during the sleep state.

Referring to FIG. 2, the sense amplifier 200 preserves common mode biasing between matched FETs 122 and 124 and reduces leakage current by not remaining in precharge during idle states of the memory by shorting the sense amplifier inputs (SAT 108 and SAC 112) during idle mode using the sense amplifier sleep circuit 201. The sleep circuit 201 includes a transmission gate formed by PMOS transistor 203 and NMOS transistor 205. The sense amplifier sleep signal (sampSleep) 207 asserts to short together SAT and SAC during idle. In addition, during idle the sense amplifier control logic sets SAPCX=1 and SAEN=0 to disable precharge and the equalization transistor and to disable the differential sense amplifier circuit 120. That sets SAT= SAC =high-Z, along with BLT 106 and BLC 110 thereby reducing leakage through the read select transistors 102 and 104. Since the sense amplifier precharge control signal SAPCX is deasserted causing the precharge transistors to be off and the tail transistor 126 is off because SAEN is deasserted, leakage from the sense amplifier precharge transistors 114 and 116 is significantly cut. The bias across the matched NFETs 122 and 124 remains equal at high Z eliminating concerns about aging induced sense amplifier mismatch on the gates of the two matched transistors 122 and 124. Thus, use of the sense amplifier sleep circuit 201 achieves both low leakage and symmetric biasing during the idle state.

In the embodiment of FIG. 2 the sleep circuit is turned off during non idle periods such as read operations when the sleep state is inactive. In an embodiment, the sampSleep control signal 246 is deasserted in conjunction with other wake operations such as precharging the bitlines, precharging SAT and SAC, and waking up any virtual power supplies used for the read operation. The sense amplifier sleep signal sampSleep is asserted during idle modes of the memory to reflect the sleep state and is deasserted for non idle modes such as for reads, or for both reads and writes, to reflect the sleep state is inactive. Idle mode implies the sense amplifier circuit 200 (or 300) is not being used for a read. The sampSleep signal typically controls a bank of memory, which is a set of memory bits sharing a sense amplifier such as sense amplifier 200 or 300 and a write driver. The size of a bank is design dependent. Some embodiments require idle mode to be deasserted in response to both read and write operations. In an embodiment the control signal sampSleep is deasserted responsive to a precharge state (SAPCX=0). In other embodiments, the sleep circuit 203 keeps SAT and SAC shorted together during the precharge state to provide another equalization path through the sleep circuit 203 in addition to the path through the equalization transistor 118.

In such an embodiment sampSleep is deasserted at the same time the precharge signal SAPCX is deasserted.

FIG. 3 illustrates another embodiment in which sense amplifier circuit 300 utilizes the equalization transistor 318 as part of the sleep circuit. The sense amplifier sleep circuit benefits from using both an NMOS transistor and a PMOS transistor as the PMOS transistor is better at passing a high voltage signal and the NMOS is better at passing a low voltage signal. Hence the pass gate shown in the sleep circuit 201 in FIG. 2 includes both PMOS transistor 203 and NMOS transistor 205. In the embodiment shown in FIG. 3 the equalization transistor is used for equalization during precharge and during the sleep state. Using the equalization transistor 318 as part of the sleep circuit in conjunction with transistor 305 requires the PMOS equalization transistor 318 to have a gate control signal 307 that turns on the PMOS equalization transistor 318 responsive to the precharge state, which is reflected in an asserted precharge signal (SAPCX) and in response to the sleep state, reflected in an asserted sampSleep signal during the idle state. That functionality is provided by the gate 309. The equalization transistor has to turn off when the sense amplifier circuit 300 is not in the sleep state and not in a precharge state. Note that since transistor 305 can remain on during precharge, a complement of control signal 307 may also be used as the gate signal for the NMOS transistor 305.

Figure 4:
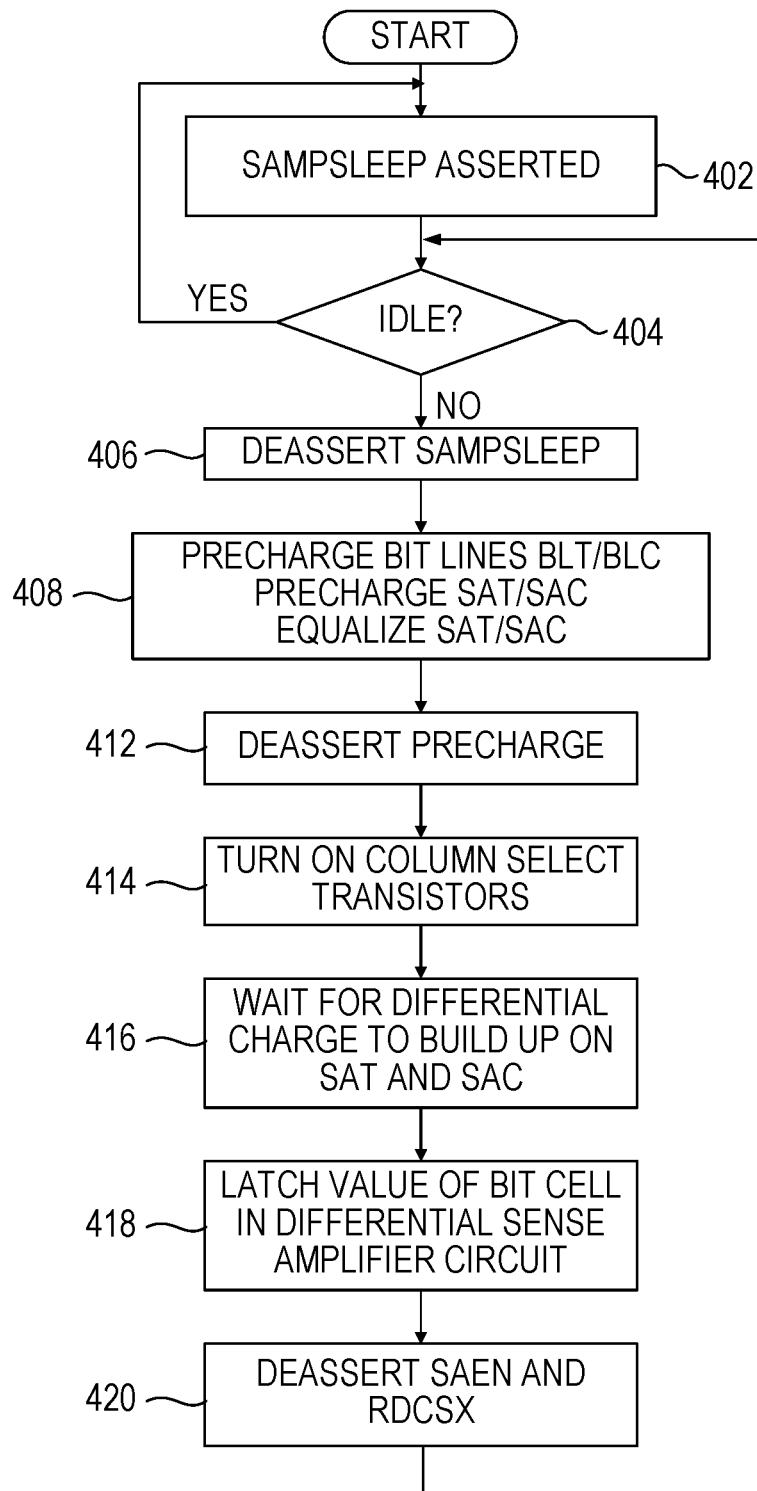
FIG. 4 illustrates a flow diagram illustrating utilization of the sleep state in a memory device.

FIG. 4 illustrates a flow diagram illustrating use of the sampSleep signal, which is active high in the illustrated embodiments of FIGS. 2 and 3. In 402, sampSleep is asserted indicating the sense amplifier sleep state is active. That may occur, e.g., after a power on or reset. In 404, the control logic checks to see if the memory is in an idle state indicative of the sleep state or in a non read state depending on the embodiment. If the memory remains idle (or no read), sampSleep remains asserted in 402. That means that the SRAM is not in a wake state responsive to a read request (or a read or write request). If the memory is in a wake state (not idle) responsive to a read request (and also to a write request in some embodiments) sampSleep is deasserted in 406 indicating the sleep state is inactive and the memory control logic performs the normal functionality for a read by precharging the bitlines (BLT and BLC), precharging the SAT and SAC lines and equalizing the SAT and SAC lines in 408. The precharge state is turned off in 412 to stop precharging SAT, SAC, and the bitlines. Note that rather than deasserting sampSleep in 406, at least one embodiment waits until 412 to deassert sampSleep at the same time as deasserting SAPCX. Thus, the sleep state and the precharge state overlap in some embodiments. In 414 the column select transistors are turned on to couple the SAT and SAC signals to BLT and BLC, respectively and the WL is turned on to select the desired row. In 416, the differential charge builds on SAT and SAC based on the stored value of the memory cell and in 418 SAEN is enabled to latch the value of the memory After the latched value has been transferred to another storage location via a bus, SAEN and RDCSX are deasserted. The flow returns to 404 to check if the memory is in idle. Assuming the memory is in idle, with no pending read requests, the flow returns to 501 to assert sampSleep indicative of the sleep state.

Figure 5:
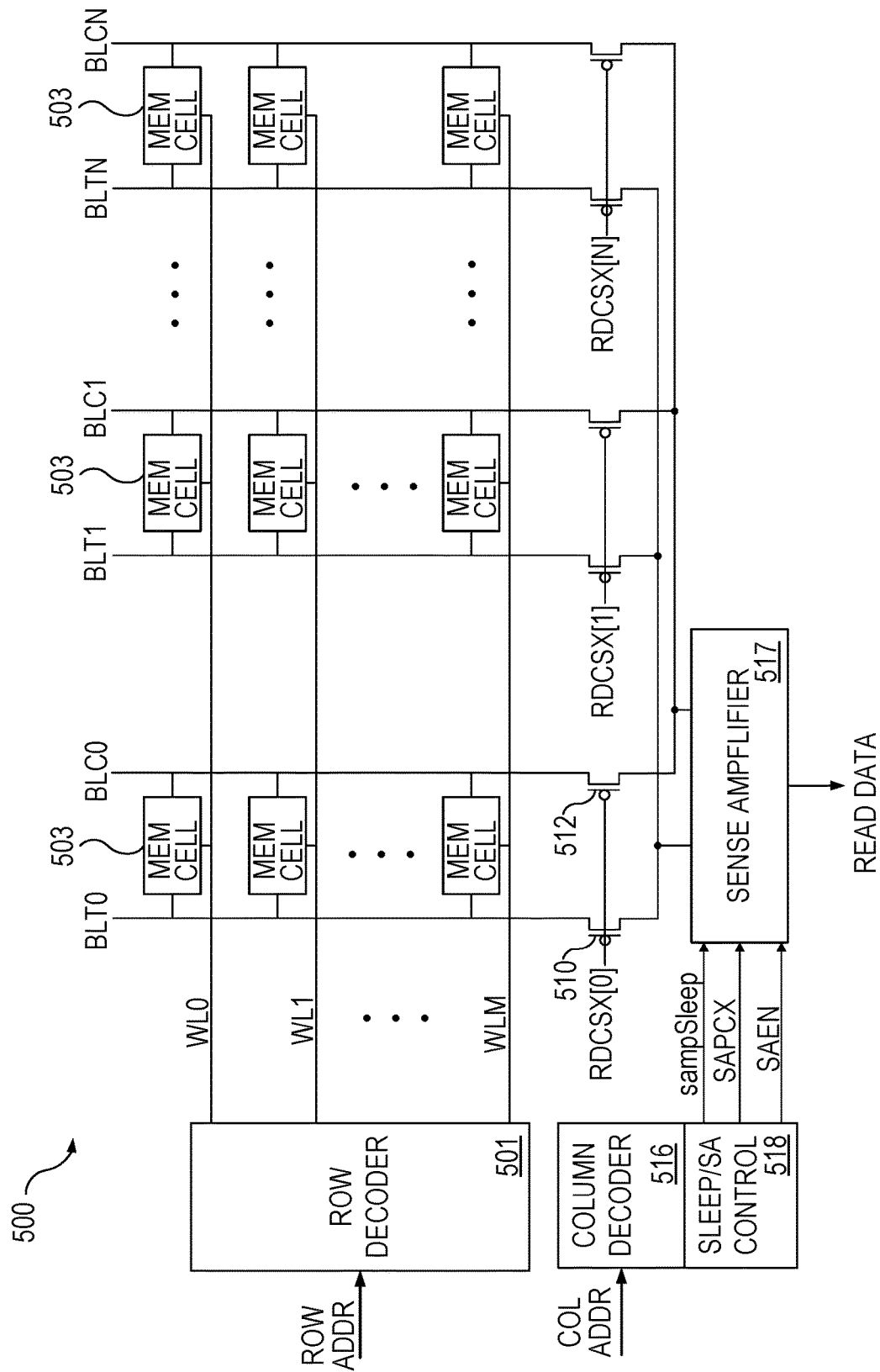
FIG. 5 illustrates a high level block diagram of a memory incorporating sense amplifier circuits with sleep states.

FIG. 5 shows a high level block diagram of a portion of an SRAM memory bank 500 placing the sense amplifier 200 (or 300) in context. The memory bank 500 includes row decoder 501 coupled to decode a row address and drive word lines WL0 through WLM based on the row address. The word lines are coupled to memory cells 503. Complementary bit lines (BLT0, BLC0, BLT1, BLC1, and BLTN, BLCN) are also coupled to the memory cells 503 and to the sense amplifier 517 through read column select transistors, e.g., 510 and 512, controlled by RDCSX[]. The column decoder 516 receives the column address and selects the appropriate bit line pair to be coupled to sense amplifier 517 using the RDCSX[] signals. In an embodiment sense amplifier 517 is the embodiment shown as sense amplifier circuit 200 or sense amplifier 300 or another embodiment described herein. The sleep/sense amplifier control logic 518 supplies the various sense amplifier control signals, shown, e.g., in FIGS. 2 and 3, based at least in part, on the on the flow diagram shown in FIG. 4 and the idle state of the SRAM memory bank 500. Note that the write driver, associated column select circuitry, and write column select signals, which are also controlled by the column decoder 516 during write operations, are not shown in FIG. 5 for ease of illustration.

Figure 6:
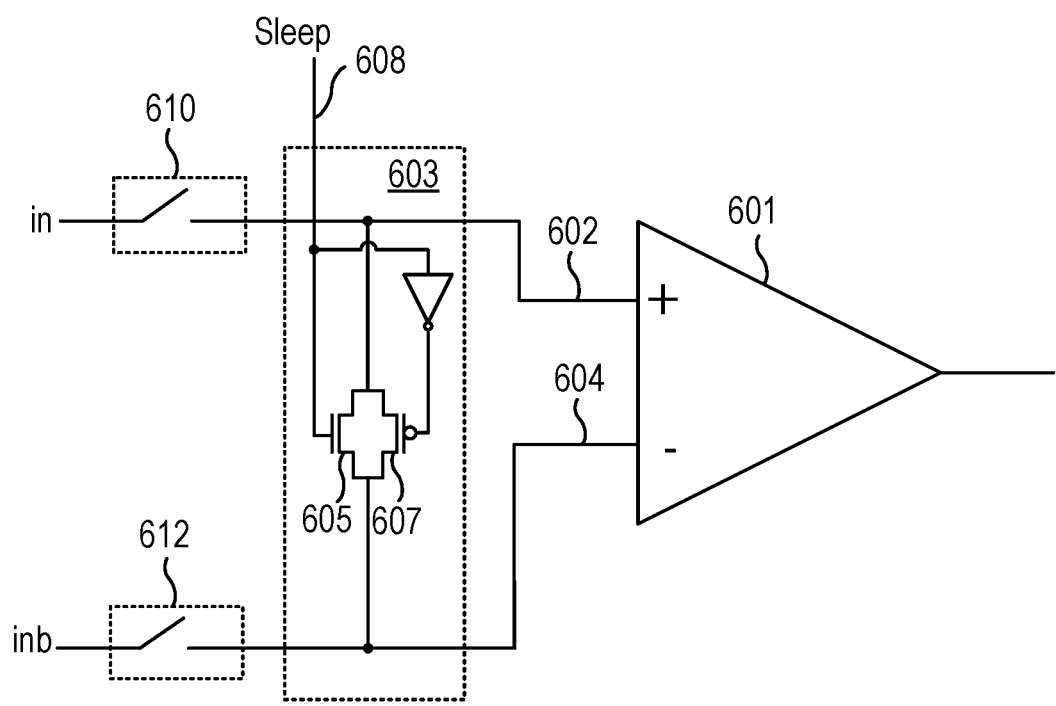
FIG. 6 illustrates a high level diagram of the sleep circuit being used with a differential amplifier.

While the description has focused on sense amplifiers in memory, the ability to approach described herein to provide leakage savings without bias mismatch can be applied more generally to differential circuits. FIG. 6 illustrates a differential amplifier 601 with inputs "in" 602 and "inb" 604. The sleep circuit 603 includes transistors 605 and 607and shorts together inputs 602 and 604 when the Sleep signal 608 is asserted to preserve common mode biasing between internal signals in the differential amplifier 601 and prevent asymmetric aging of amplifier FETs. Switches 610 and 612 isolate the differential amplifier 601 during sleep mode causing inputs 602 and 604 to be floating. When not in sleep mode, the switches 610 and 612 are closed and the transistors 603 and 605 are off.

Thus, a sense amplifier has been shown that is simultaneously biased during idle states both for low mismatch thereby reducing asymmetric aging concerns and for low leakage. The description of the invention set forth herein is illustrative and is not intended to limit the scope of the invention as set forth in the following claims. Variations and modifications of the embodiments disclosed herein may be made based on the description set forth herein, without departing from the scope of the invention as set forth in the following claims.

What is claimed is:

1. A memory comprising:
   a sense amplifier circuit including,
      a first read select transistor coupled between a true bit line and a sense amplifier true signal line and a second read select transistor coupled between a complement bit line and a sense amplifier complement signal line;
      a precharge circuit responsive to a precharge state to precharge the sense amplifier true signal line and the sense amplifier complement signal line to a predetermined voltage;
      an equalization circuit responsive to the precharge state to short the sense amplifier complement signal line and the sense amplifier true signal line;
      a differential sense amplifier circuit having a first input coupled to the sense amplifier true signal line and a second input coupled to the sense amplifier complement signal line; and
      a sense amplifier sleep circuit responsive to a sleep state to short the sense amplifier complement signal line and the sense amplifier true signal line during the sleep state.

2. The memory as recited in claim 1 wherein the equalization circuit comprises:
   an equalization transistor having a first current carrying node coupled to the sense amplifier true signal line and a second current carrying node coupled to the sense amplifier complement signal line and a gate node coupled to an equalization gate control signal that asserts responsive to at least the precharge state.

3. The memory as recited in claim 2 wherein the equalization gate control signal is asserted responsive to the precharge state and deasserted responsive to the precharge state being inactive.

4. The memory, as recited in claim 2 wherein the equalization gate control signal is asserted responsive to the sleep state and to the precharge state.

5. The memory as recited in claim 2 wherein the sense amplifier sleep circuit further comprises:
   a first sense amplifier sleep transistor of a first type coupled between the sense amplifier true signal line and the sense amplifier complement signal line;
   the equalization transistor, the equalization transistor being of a second type; and
   wherein a gate of the first sense amplifier sleep transistor is coupled to a sense amplifier gate control signal indicative of the sleep state and wherein the equalization gate control signal is asserted responsive to a logical OR of the sleep state and the precharge state.

6. The memory as recited in claim 2 wherein the sense amplifier sleep circuit further comprises:
   a first sense amplifier sleep transistor of a first type coupled between the sense amplifier true signal line and the sense amplifier complement signal line;
   the equalization transistor, the equalization transistor being of a second type; and
   wherein a first gate of the first sense amplifier sleep transistor is coupled to a complement of the equalization gate control signal, wherein the equalization gate control signal is asserted responsive to a logical OR of the sleep state and the precharge state.

7. The memory as recited in claim 1 wherein the sense amplifier sleep circuit further comprises:
   a first sense amplifier sleep transistor of a first type coupled between the sense amplifier true signal line and the sense amplifier complement signal line;
   a second sense amplifier sleep transistor of a second type coupled between the sense amplifier true signal line and the sense amplifier complement signal line; and
   wherein respective gates of the first and second sense amplifier sleep transistors are coupled to a sleep state signal indicative of the sleep state.

8. The memory, as recited in claim 7 wherein the sleep state signal is further indicative of the precharge state.

9. The memory, as recited in claim 1, wherein the precharge circuit further comprises:
   a first precharge transistor coupled between a first power supply node and sense amplifier true signal line and a second precharge transistor coupled between the first power supply node and the sense amplifier complement signal line, respective gates of the first precharge transistor and the second precharge transistor coupled to a precharge control signal indicative of the precharge state.

10. The memory, as recited in claim 1, wherein the sleep state is active during a write of the memory.

11. The memory, as recited in claim 1, wherein the sleep state is inactive during a read of the memory.

12. The memory, as recited in claim 1, wherein the sleep state is active during an idle state of the memory when no read operations and no write operations are occurring.

13. The memory, as recited in claim 1, wherein sleep state is active during at least a portion of time that the precharge state is not active.

\* \* \* \* \*